US011058219B2

(12) United States Patent
Chen et al.

(10) Patent No.: US 11,058,219 B2
(45) Date of Patent: Jul. 13, 2021

(54) SLIDE RAIL ASSEMBLY AND BRACKET MECHANISM THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/725,103

(22) Filed: Dec. 23, 2019

(65) Prior Publication Data
US 2021/0059407 A1   Mar. 4, 2021

(30) Foreign Application Priority Data
Aug. 28, 2019  (TW) .................................. 108131173

(51) Int. Cl.
| A47B 57/54 | (2006.01) |
| A47B 88/407 | (2017.01) |
| A47B 57/36 | (2006.01) |

(52) U.S. Cl.
CPC ............ *A47B 57/545* (2013.01); *A47B 57/36* (2013.01); *A47B 88/407* (2017.01)

(58) Field of Classification Search
CPC ...... A47B 57/545; A47B 88/407; A47B 57/36

USPC ...................................................... 248/219.1
See application file for complete search history.

(56) References Cited

U.S. PATENT DOCUMENTS

| 6,622,873 | B2 | 9/2003 | Hegrenes et al. | |
| 7,762,411 | B2 * | 7/2010 | Hilburn .................. | A47B 88/43 211/192 |
| 8,371,454 | B2 * | 2/2013 | Chen ..................... | H05K 7/1489 211/26 |
| 8,596,471 | B2 * | 12/2013 | Chen ..................... | H05K 7/1421 211/26 |
| 8,602,225 | B2 * | 12/2013 | Lin ....................... | H05K 7/1489 211/26 |
| 8,807,351 | B2 * | 8/2014 | Lin ........................ | A47B 88/43 211/26 |
| 10,051,759 | B1 | 8/2018 | Chen | |
| 10,251,482 | B2 * | 4/2019 | Chen ..................... | A47B 57/545 |
| 10,278,498 | B2 | 5/2019 | Chen et al. | |
| 10,306,983 | B2 | 6/2019 | Chen et al. | |
| 10,617,029 | B2 | 4/2020 | Chen et al. | |

(Continued)

*Primary Examiner* — Muhammad Ijaz
(74) *Attorney, Agent, or Firm* — Alan D. Kamrath; Karin L. Williams; Mayer & Williams PC (57) ABSTRACT

A bracket mechanism includes a connecting wall and a mounting device. The mounting device and the connecting wall are movable relative to each other to be in a locking state or an unlocking state. The mounting device includes at least one mounting member. When the mounting device and the connecting wall are in the locking state, the at least one mounting member is adjacent to the connecting wall to be closed relative to each other. When the mounting device and the connecting wall are in the unlocking state, the at least one mounting member is away from the connecting wall to be opened relative to each other.

14 Claims, 8 Drawing Sheets

(56) References Cited

U.S. PATENT DOCUMENTS

2015/0335156 A1\* 11/2015 Chen ................ A47B 96/07
                                                                           248/219.1
2017/0013959 A1\* 1/2017 Chen ................ A47B 96/067
2018/0168349 A1 6/2018 Chen et al.

\* cited by examiner

SLIDE RAIL ASSEMBLY AND BRACKET MECHANISM THEREOF

BACKGROUND OF THE INVENTION

1. Field of the Invention

The present invention relates to a slide rail assembly, and more particularly, to a slide rail assembly having brackets.

2. Description of the Prior Art

U.S. Pat. No. 10,306,983 B2 discloses a slide rail mechanism. The slide rail mechanism comprises a rail member, a first supporting frame, a second supporting frame, a bracket and a reinforcing member movably mounted to the rail member and the first supporting frame. When the second supporting frame is located at a first position relative to the bracket, a fastening member is configured to be in a first state (such as a locking state) relative to at least one mounting member. When the second supporting frame is located at a second position relative to the bracket, the fastening member is switched from the first state to a second state (such as an unlocking state) relative to the at least one mounting member. When the second supporting frame is located at the first position, the second supporting frame is engaged with a second engaging feature of the bracket through a first engaging feature of an elastic member, and the first engaging feature corresponds to a blocking wall of the second engaging feature. Thereby, the second supporting frame can be held at the first position relative to the first bracket.

However, the slide rail mechanism disclosed in the aforementioned patent has a more complex structure. Therefore, when a user wants to mount the slide rail mechanism to a rack, such arrangement is not intuitive to operate.

U.S. Pat. No. 7,762,411 B2 discloses a tool-less rack rail system incorporating clamping mechanism. The rack rail system includes a rail assembly, and a flange and a clamp arranged on the rail assembly. The flange is configured to be extended from the rail assembly and arranged with at least one pin. Therefore, the rail assembly can be regarded as having the at least one pin. On the other hand, the clamp is pivotally connected to the flange, and the clamp comprises a front portion, a rear portion and a middle portion connected to the front and rear portions to form a U-shaped cross-section. When the clamp is closed relative to the flange, a protrusion of the clamp is engaged with an opening (or a recess) of the flange, such that the clamp can be held in the closed state relative to the flange.

Overall, the at least one pin disclosed in the second patent is arranged on the flange extended from the rail assembly (the rail assembly can be regarded as having the at least one pin). Therefore, the rail assembly can be mounted to a post through inserting the at least one pin into a hole of the post. However, a user must move further to a position near the post, in order to manually operate the clamp to be closed relative to the flange, so as to complete mounting the rail assembly to the post. Thus, such arrangement is not convenient enough for the user in operation.

U.S. Pat. No. 6,622,873 B2 discloses a rack rail assembly. The rail assembly comprises a mounting bracket. The mounting bracket comprises an alignment plate, a back-up plate fixedly mounted to the alignment plate through a rivet, and a flange of a rail sandwiched between the alignment plate and the back-up plate. At least one pin penetrates through the alignment plate, the back-up plate and the flange of the rail. The at least one pin is configured to be inserted into an aperture of a post of a rack, such that the rail assembly can be mounted to the rack.

Overall, the back-up plate and the alignment plate of the mounting bracket disclosed in the third patent are fixed to each other through the rivet, and it also requires a plurality of fixing members (such as screws) to mount and fix the mounting bracket to the rack.

The aforementioned patents have disclosed related techniques of the slide rail brackets. However, for different market requirements, it is important to develop various products different from the conventional slide rail and/or bracket, to provide more selections in the market for development of the industry.

SUMMARY OF THE INVENTION

The present invention provides a bracket mechanism and a slide rail assembly having the bracket mechanism.

According to an embodiment of the present invention, a bracket mechanism comprises a connecting wall and amounting device. The mounting device and the connecting wall are movable relative to each other to be in one of a locking state and an unlocking state. The mounting device comprises at least one mounting member configured to be mounted to a post. When the mounting device and the connecting wall are in the locking state, the at least one mounting member is adjacent to the connecting wall to be closed relative to each other. When the mounting device and the connecting wall are in the unlocking state, the at least one mounting member is away from the connecting wall to be opened relative to each other.

Preferably, the connecting wall and the mounting device are pivoted relative to each other.

Preferably, the connecting wall has a longitudinal length. The bracket mechanism further comprises a pivot shaft. The pivot shaft is arranged in a direction substantially identical to a direction of the longitudinal length. The connecting wall and the mounting device are pivoted relative to each other through the pivot shaft.

Preferably, the mounting device further comprises an end wall. The at least one mounting member is arranged on the end wall. The end wall is pivotally connected to the connecting wall through the pivot shaft.

Preferably, the mounting device further comprises an extension wall substantially perpendicularly connected to the end wall. The extension wall and the connecting wall are respectively arranged with a first structure and a second structure corresponding to each other. When the mounting device and the connecting wall are in the locking state, the first structure and the second structure are connected to each other. When the mounting device and the connecting wall are in the unlocking state, the first structure and the second structure are not connected to each other.

Preferably, at least one of the connecting wall and the mounting device has a limiting feature. When the mounting device and the connecting wall are in the unlocking state relative to each other, the mounting device and the connecting wall are held in the unlocking state through the limiting feature.

Preferably, the connecting wall is arranged with a fastening member. When the mounting device and the connecting wall are in the locking state, the fastening member is adjacent to the at least one mounting member. When the mounting device and the connecting wall are in the unlocking state, the fastening member is away from the at least one mounting member.

According to another embodiment of the present invention, a bracket mechanism comprises a connecting wall, a mounting device and a pivot shaft. The connecting wall has a longitudinal length. The mounting device comprises at least one mounting member. The pivot shaft is arranged in a direction substantially identical to a direction of the longitudinal length. The connecting wall and the mounting device are pivoted relative to each other through the pivot shaft.

According to another embodiment of the present invention, a slide rail assembly comprises a first rail, a first bracket mechanism and a second bracket mechanism. The first bracket mechanism is arranged adjacent to a first end part of the first rail. The second bracket mechanism is arranged adjacent to a second end part of the first rail away from the first end part. The first bracket mechanism is longitudinally movable relative to the first rail through an extension rail. The first bracket mechanism comprises a connecting wall and a mounting device. The connecting wall is arranged on the extension rail. The mounting device and the connecting wall are movable relative to each other to be in one of a locking state and an unlocking state.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
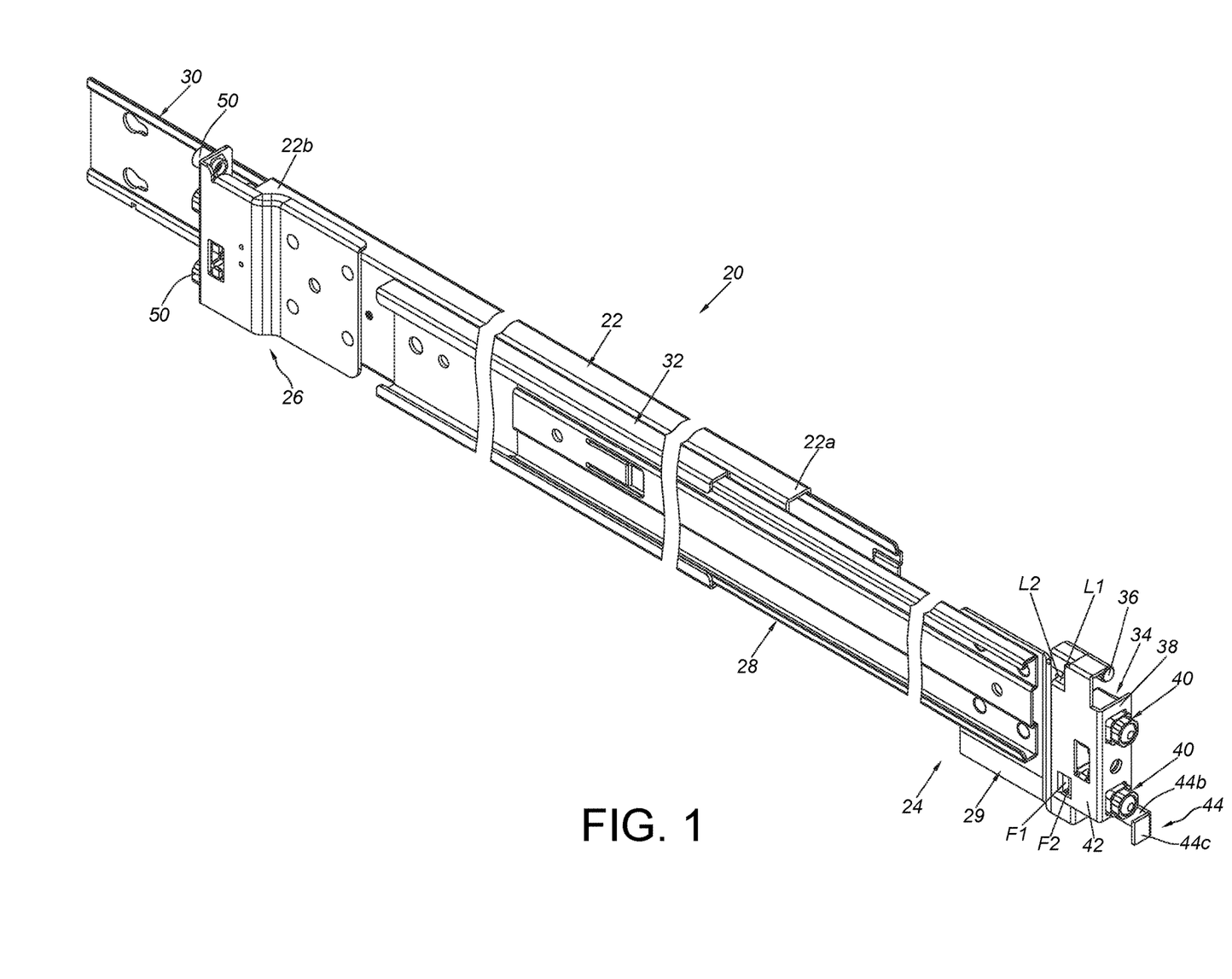
FIG. 1 is a diagram showing a slide rail assembly according to an embodiment of the present invention.
Figures 2, 3:
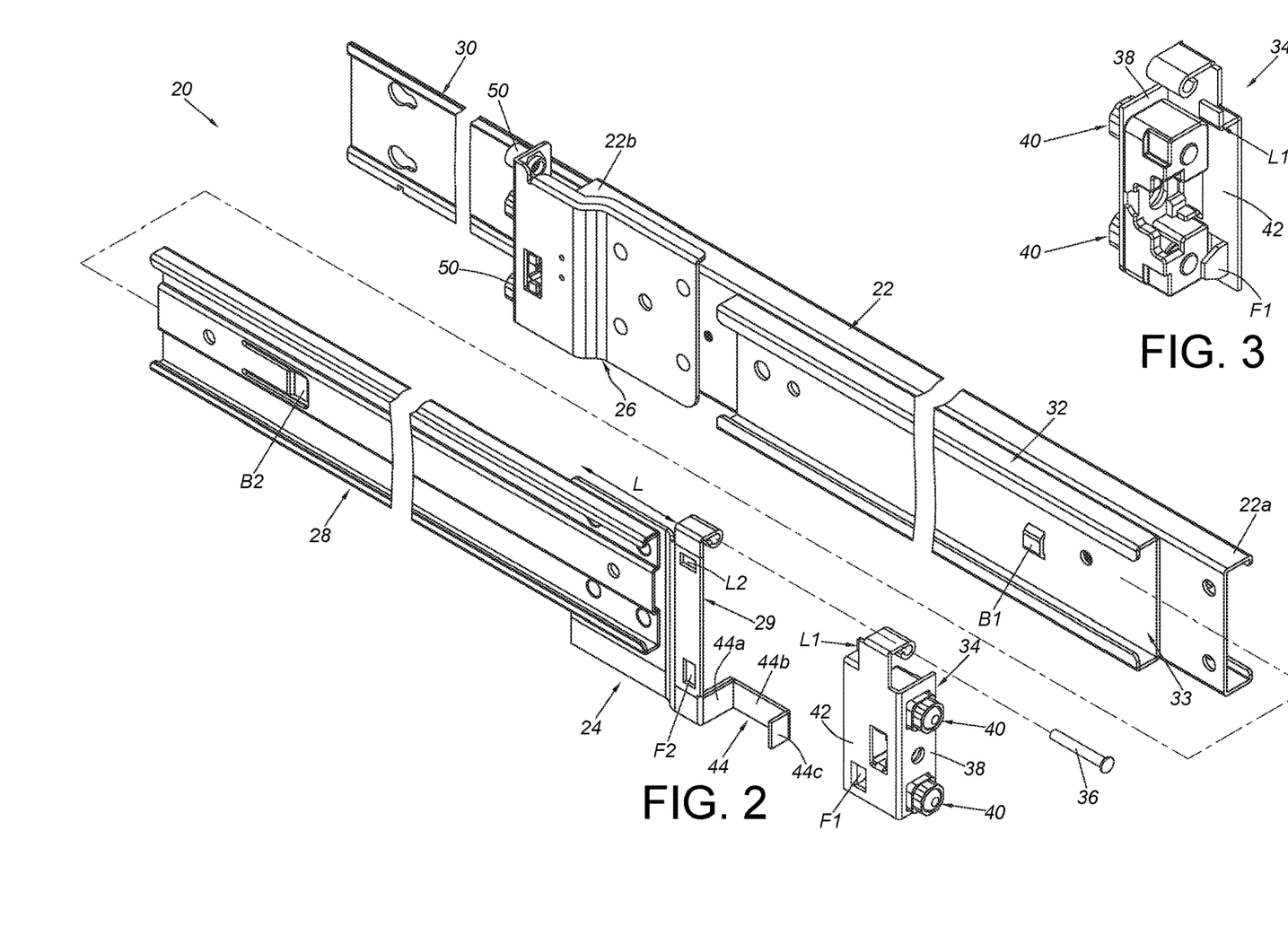
FIG. 2 is an exploded view of the slide rail assembly according to an embodiment of the present invention.
FIG. 3 is a diagram showing a mounting device of a first bracket mechanism according to an embodiment of the present invention.

As shown in FIG. 1 and FIG. 2, a slide rail assembly 20 comprises a first rail 22, a first bracket mechanism 24 and a second bracket mechanism 26 according to an embodiment of the present invention.

The first bracket mechanism 24 is arranged adjacent to a first end part 22a of the first rail 22, and the second bracket mechanism 26 is arranged adjacent a second end part 22b of the first rail 22 away from the first end part 22a.

Preferably, the first bracket mechanism 24 is longitudinally movable relative to the first rail 22 through an extension rail 28. The extension rail 28 is located at a first side of the first rail 22. The slide rail assembly 20 further comprises a second rail 30 located at a second side of the first rail 22 opposite to the first side. The second rail 30 is longitudinally movable relative to the first rail 22.

Preferably, the first side of the first rail 22 is arranged with a reinforcing member 32. The reinforcing member 32 is configured to reinforce the first rail 22 for improving the structural strength of the first rail 22. Furthermore, the reinforcing member 32 is fixedly connected to the first rail 22 to be seen as a portion of the first rail 22. The reinforcing member 32 has a passage 33. The extension rail 28 is retractable and movable relative to the first rail 22 through the passage 33 of the reinforcing member 32. Preferably, the reinforcing member 32 has a first limiting structure B1 arranged in the passage 33, and the extension rail 28 has a second limiting structure B2 configured to interact with the first limiting structure B1, so as to allow the extension rail 28 to move relative to the reinforcing member 32 within a limited range. The first limiting structure B1 and the second limiting structure B2 can be a combination of a protrusion and a flexible arm, but the present invention is not limited thereto.

The first bracket mechanism 24 comprises a connecting wall 29 and a mounting device 34.

The connecting wall 29 is arranged on the extension rail 28, and located outside the passage 33 of the reinforcing member 32. In the present embodiment, the connecting wall 29 is fixedly connected to the extension rail 28 (the extension rail 28 can be regarded as a slide rail) to be seen as a portion of the extension rail 28. On the other hand, the mounting device 34 and the connecting wall 29 are movably connected to each other. Preferably, the mounting device 34 and the connecting wall 29 are pivoted relative to each other. For example, the connecting wall 29 (or the extension rail 28) has a longitudinal length L, and the first bracket mechanism 24 further comprises a pivot shaft 36. The pivot shaft 36 is arranged in a direction substantially identical to a direction of the longitudinal length L (that is, a direction of the pivot shaft 36 and the direction of the longitudinal length L are substantially identical to a longitudinal direction of the first rail 22). The connecting wall 29 and the mounting device 34 are pivoted relative to each other through the pivot shaft 36.

Preferably, the mounting device 34 comprises an end wall 38 and at least one mounting member 40 arranged on the end wall 38, and the end wall 38 is pivotally connected to the connecting wall 29 through the pivot shaft 36.

Preferably, the mounting device 34 further comprises an extension wall 42 substantially particularly connected to the end wall 38, and the extension wall 42 and the connecting wall 29 are respectively arranged with a first structure F1 and a second structure F2 corresponding to each other (please also refer to FIG. 3). The first structure F1 can be connected to the second structure F2 by insertion, fastening or engaging. In the present embodiment, the first structure F1 and the second structure F2 are a combination of a protrusion and a hole (or a recessed part), but the present invention is not limited thereto.

Preferably, at least one of the mounting device 34 and the connecting wall 29 has a limiting feature. In the present embodiment, the extension wall 42 of the mounting device 34 and the connecting wall 29 are respectively arranged with a first limiting feature L1 and a second limiting feature L2 corresponding to each other. The first limiting feature L1 can be an extension leg, and the second limiting feature L2 can be a hole (or a recessed part), but the present invention is not limited thereto. Moreover, the first limiting feature L1 is configured to pass through the second limiting feature L2 to support or abut against a wall surface of the connecting wall 29, such that a predetermined open angle can be formed between the mounting device 34 and the connecting wall 29.

Preferably, one of the connecting wall 29 and the mounting device 34 is arranged with a fastening member 44. In the present embodiment, the connecting wall 29 is arranged with the fastening member 44, and the fastening member 44 has a fastening part 44c. Preferably, the fastening member 44 further comprises a connecting part 44a and an extension part 44b. The connecting part 44a is substantially perpendicularly bent relative to the connecting wall 29. The extension part 44b is substantially perpendicularly bent relative to the connecting part 44a, and the extension part 44b is substantially arranged in the longitudinal direction of the first rail 22. The fastening part 44c is bent relative to the extension part 44b.

Figure 4:
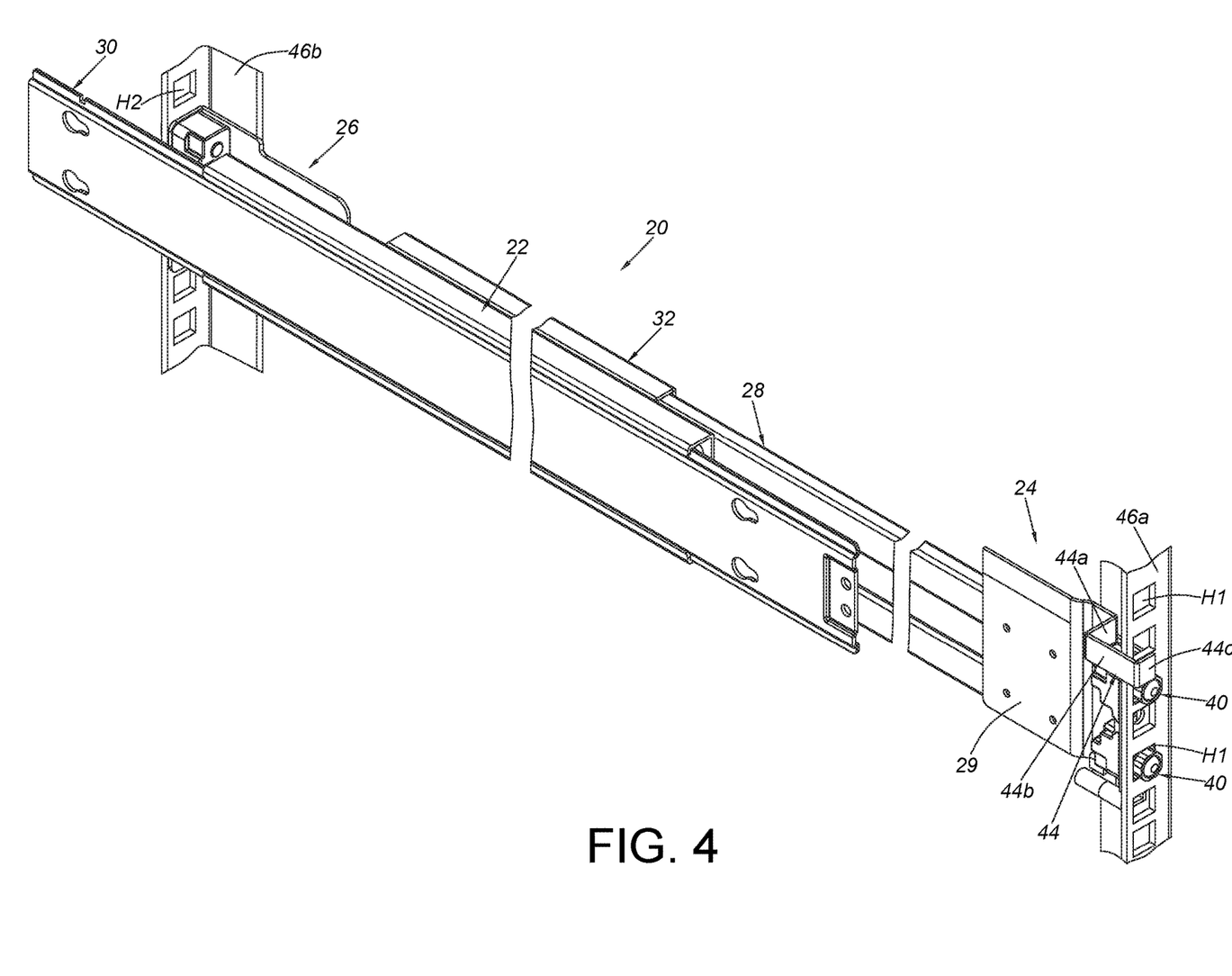
FIG. 4 is a diagram showing the slide rail assembly being mounted to a rack through the first bracket mechanism and a second bracket mechanism according to an embodiment of the present invention.
Figure 5:
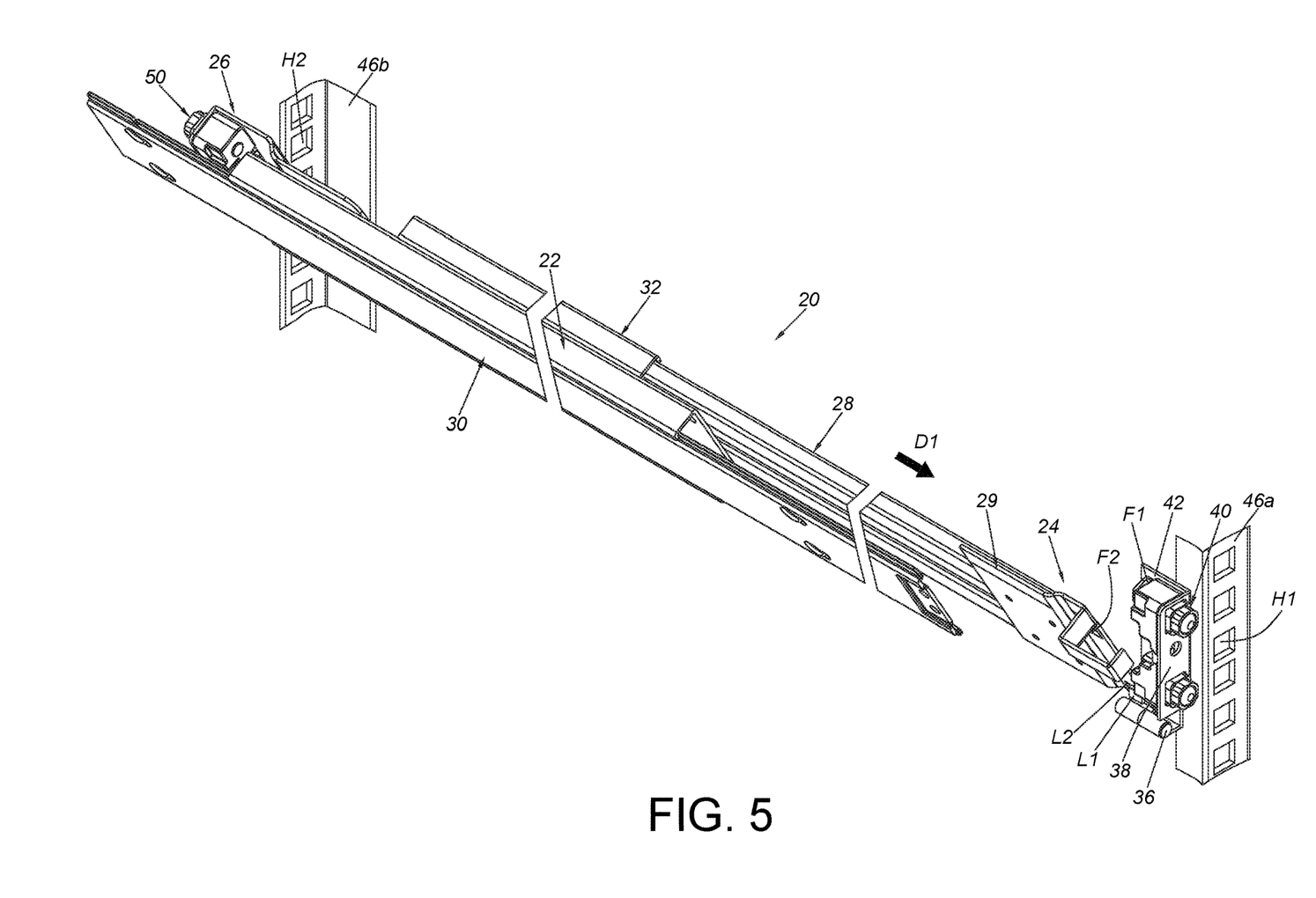
FIG. 5 is a diagram showing the first bracket mechanism and the second bracket mechanism of the slide rail assembly before being mounted to a first post and a second post of the rack according to an embodiment of the present invention.

As shown in FIG. 4, the slide rail assembly 20 is configured to be mounted to a rack through the first bracket mechanism 24 and the second bracket mechanism 26. Specifically, the at least one mounting member 40 of the first bracket mechanism 24 is configured to be inserted into a first mounting hole H1 of a first post 46a of the rack, in order to mount the first rail 22 to the first post 46a. Preferably, the fastening part 44c of the fastening member 44 is configured to fasten or lock the first post 46a (a target object), such that the first post 46a is located between the end wall 38 of the mounting device 34 and the fastening part 44c of the fastening member 44 in order to prevent the slide rail assembly 20 from being detached from the first post 46a. On the other hand, the second bracket mechanism 26 comprises at least one connecting member 50 (please also refer to FIG. 5 showing the connecting member 50). The at least one connecting member 50 of the second bracket mechanism 26 is configured to be inserted into a second mounting hole H2 of a second post 46b of the rack, in order to mount the first rail 22 to the second post 46b.

Figure 6:
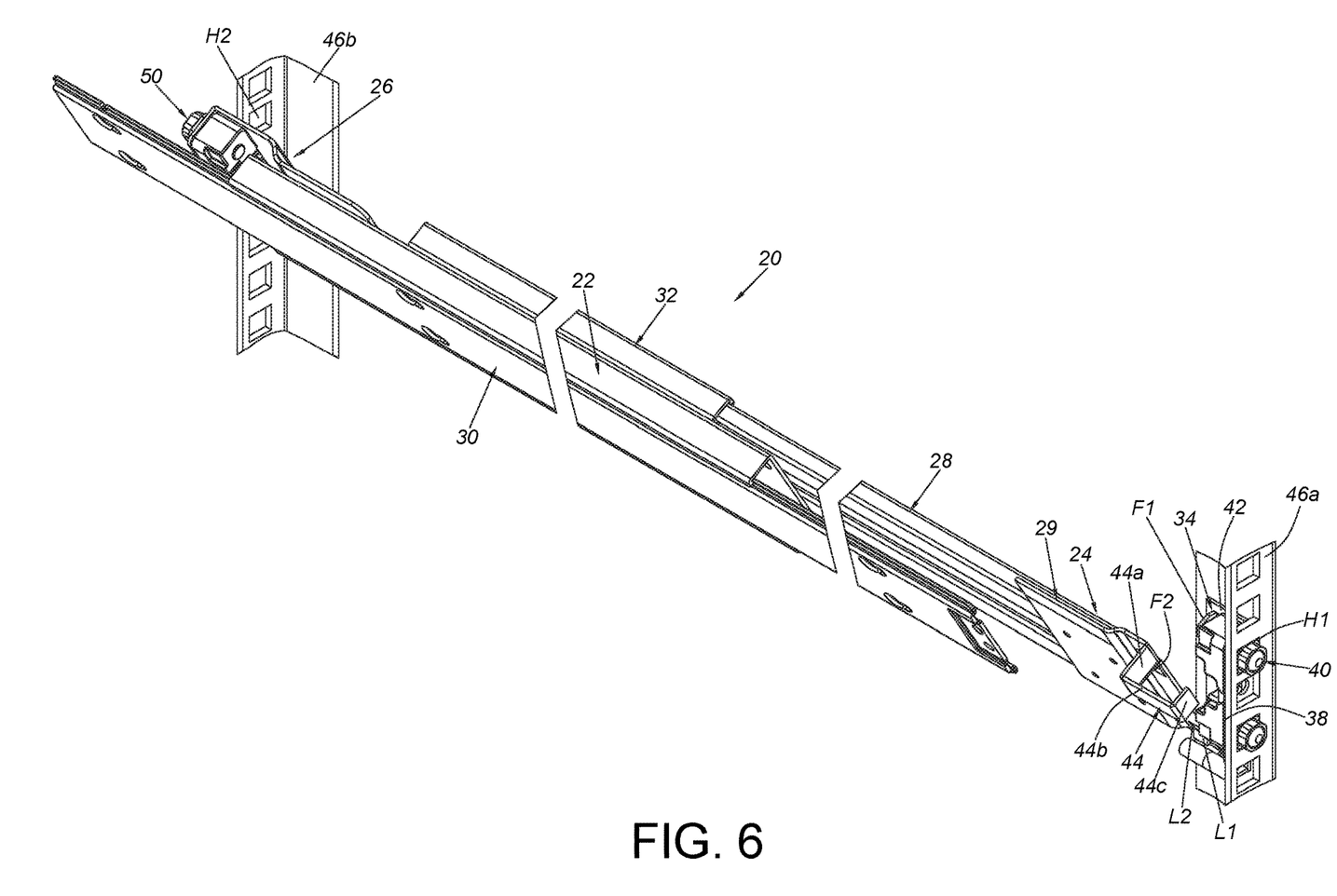
FIG. 6 is a diagram showing the first bracket mechanism of the slide rail assembly being in an unlocking state with at least one mounting member of the first bracket mechanism being inserted into the first post while the second bracket mechanism is not mounted to the second post according to an embodiment of the present invention.

As shown in FIG. 5 and FIG. 6, the mounting device 34 and the connecting wall 29 are movable relative to each other to be in an unlocking state. Moreover, when the mounting device 34 and the connecting wall 29 are in the unlocking state, the mounting device 34 and the connecting wall 29 are rotated relative to each other to be opened, and the fastening member 44 is away from the at least one mounting member 40 of the mounting device 34. Meanwhile, the first structure F1 and the second structure F2 are not connected to each other (please also refer to FIG. 9). Preferably, the first limiting feature L1 of the mounting device 34 is configured to support or abut against the wall surface of the connecting wall 29 in order to hold the mounting device 34 and the connecting wall 29 in the unlocking state.

In addition, when a user is going to mount the slide rail assembly 20 to the rack, the user can stand at a position (such as a position near by the second post 46b) to move the slide rail assembly 20 toward the first post 46a along a first direction D1 (as shown in FIG. 5), such that the at least one mounting member 40 of the first bracket mechanism 24 is inserted into the first mounting hole H1 of the first post 46a, and the at least one mounting member 40 abuts against an inner wall of the first mounting hole H1 to work as a supporting point (as shown in FIG. 6).

Figure 7:
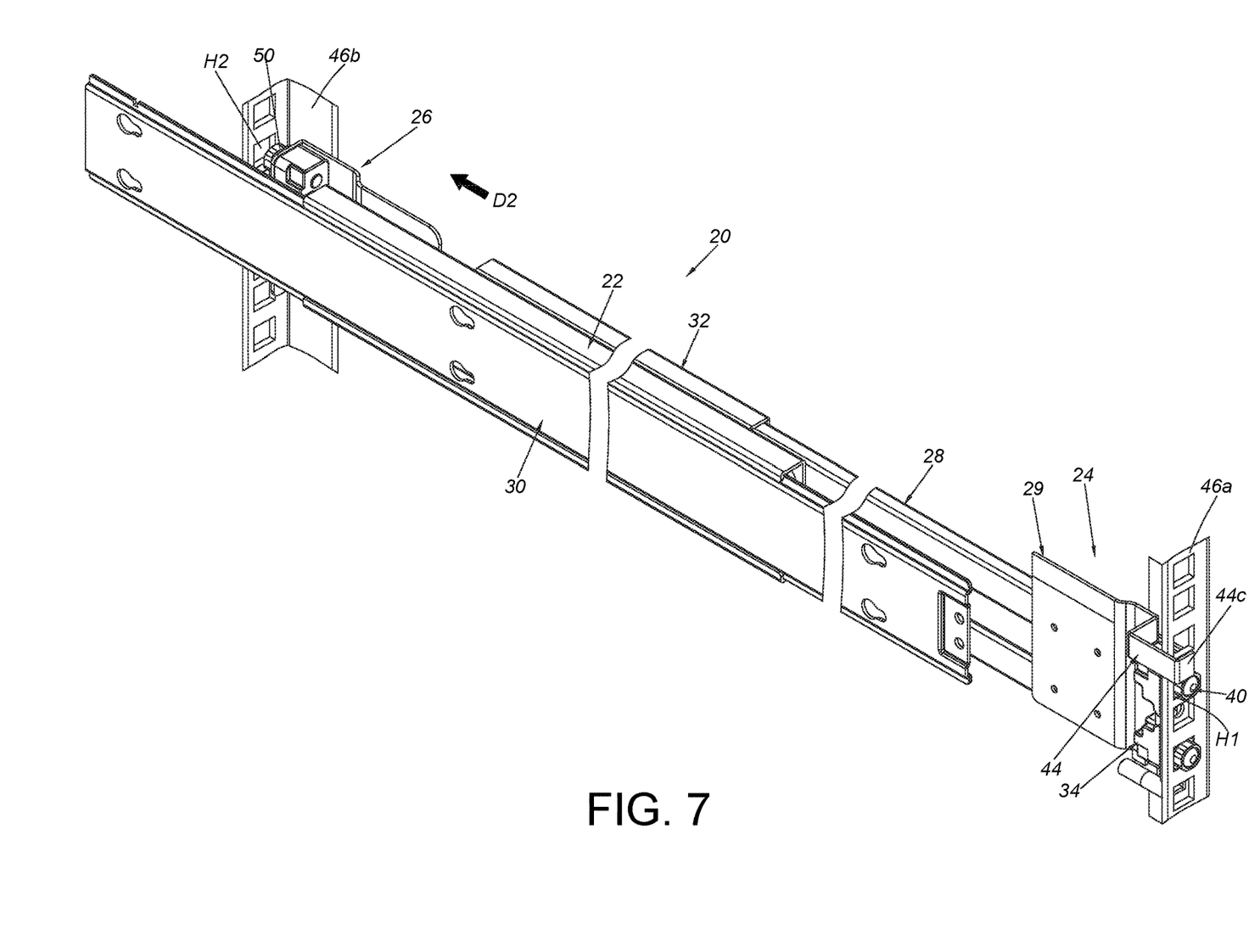
FIG. 7 is a diagram showing the first bracket mechanism of the slide rail assembly being in a locking state to lock the first post while the second bracket mechanism is not mounted to the second post according to an embodiment of the present invention.

As shown in FIG. 7, the mounting device 34 and the connecting wall 29 are movable relative to each other to be in a locking state. For example, when the mounting device 34 and the connecting wall 29 are operated by the user to be in the locking state, the mounting device 34 and the connecting wall 29 are rotated relative to each other to be closed, in order to lock the first post 46a. Preferably, the fastening member 44 is moved to be adjacent to the at least one mounting member 40 of the mounting device 34, such that the fastening part 44c of the fastening member 44 can fasten or lock the first post 46a. Meanwhile, the first structure F1 and the second structure F2 are connected to each other in order to hold the mounting device 34 and the connecting wall 29 in the locking state (please also refer to FIG. 10). Thereby, the first bracket mechanism 24 is mounted to the first post 46a.

Figure 8:
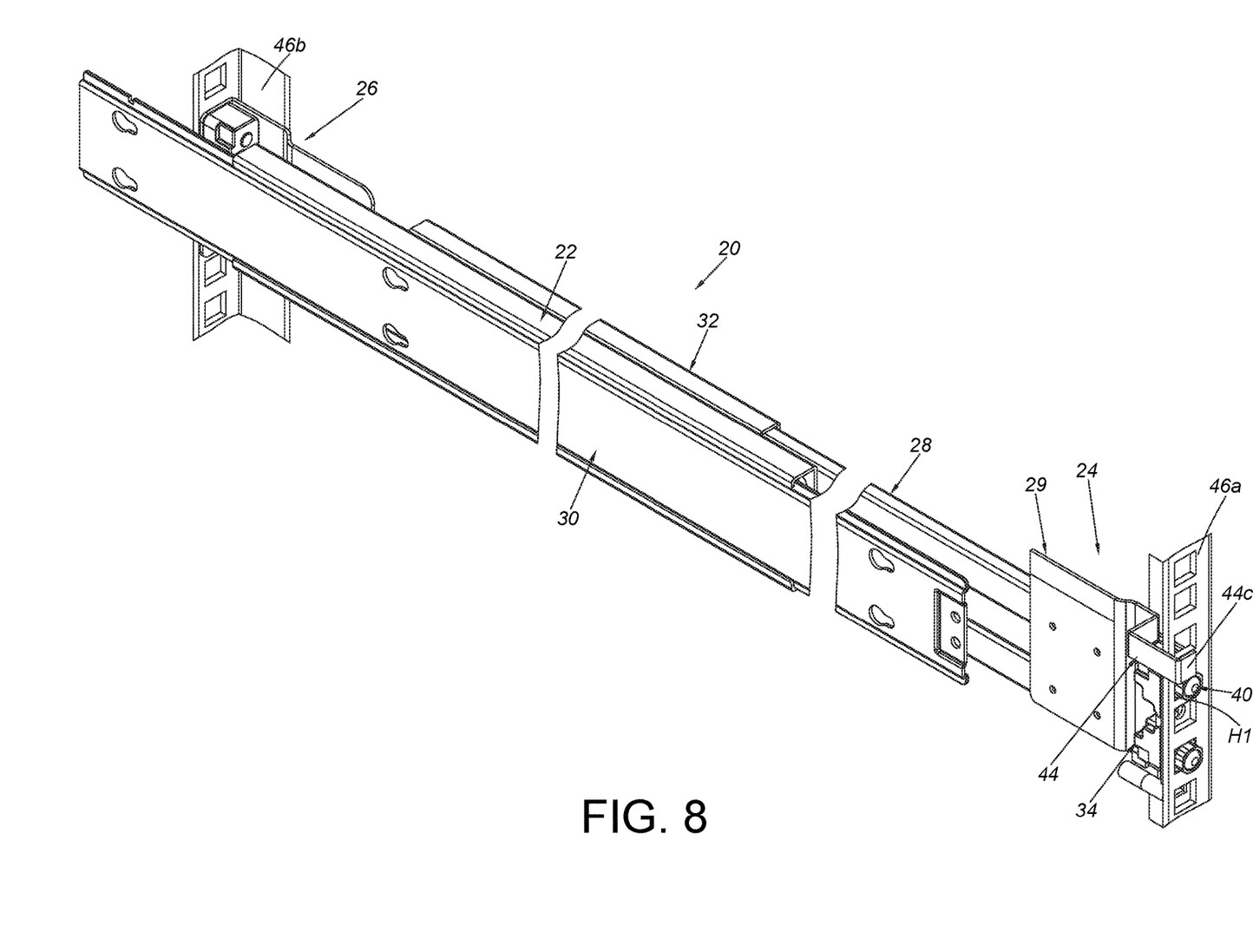
FIG. 8 is a diagram showing the first bracket mechanism and the second bracket mechanism of the slide rail assembly being mounted to the first post and the second post of the rack according to an embodiment of the present invention.

As shown in FIG. 7 and FIG. 8, when the first bracket mechanism 24 has been mounted to the first post 46a, the user standing at the same position (such as the position near by the second post 46b) can move the second bracket mechanism 26 toward the second post 46b along a second direction D2 (as shown in FIG. 7), such that the at least one connecting member 50 of the second bracket mechanism 26 can be inserted into the second mounting hole H2 of the second post 46b (as shown in FIG. 8) in order to mount the second bracket mechanism 26 to the second post 46b.

Moreover, when the user is going to detach the slide rail assembly 20 from the rack, operation procedures can follow a sequence FIG. 8, FIG. 7, FIG. 6 and FIG. 5. For simplicity, no further illustration is provided.

Figure 9:
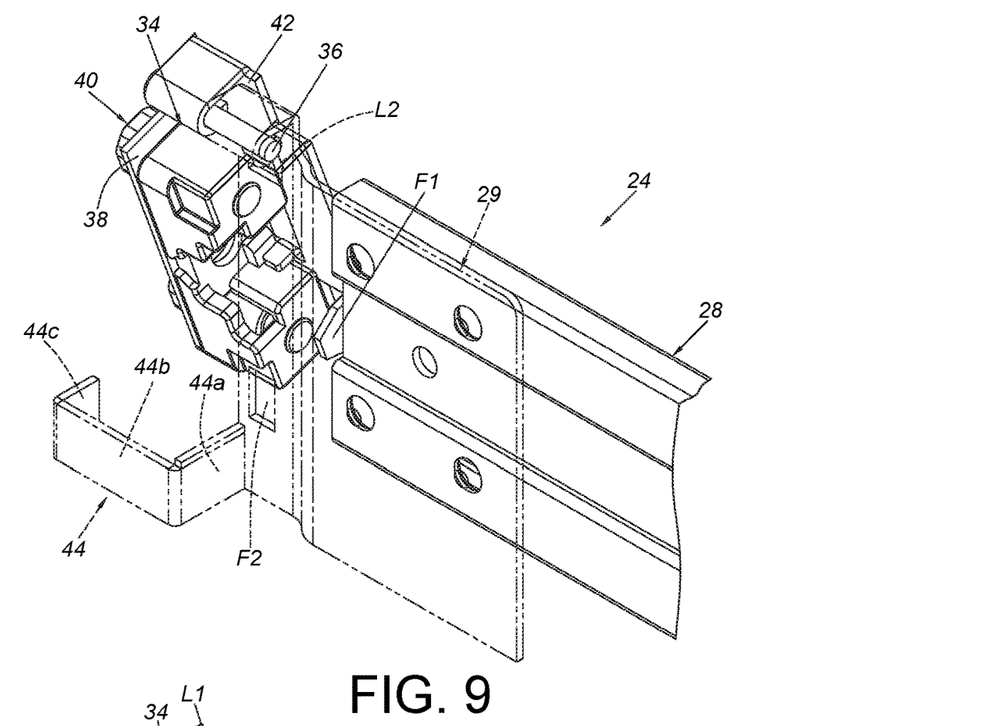
FIG. 9 is a diagram showing the first bracket mechanism being in the unlocking state according to an embodiment of the present invention.

As shown in FIG. 9, when the mounting device 34 and the connecting wall 29 are in the unlocking state relative to each other, the at least one mounting member 40 is away from the connection wall 29 to be opened relative to each other, and the first structure F1 and the second structure F2 are not connected to each other.

Figure 10:
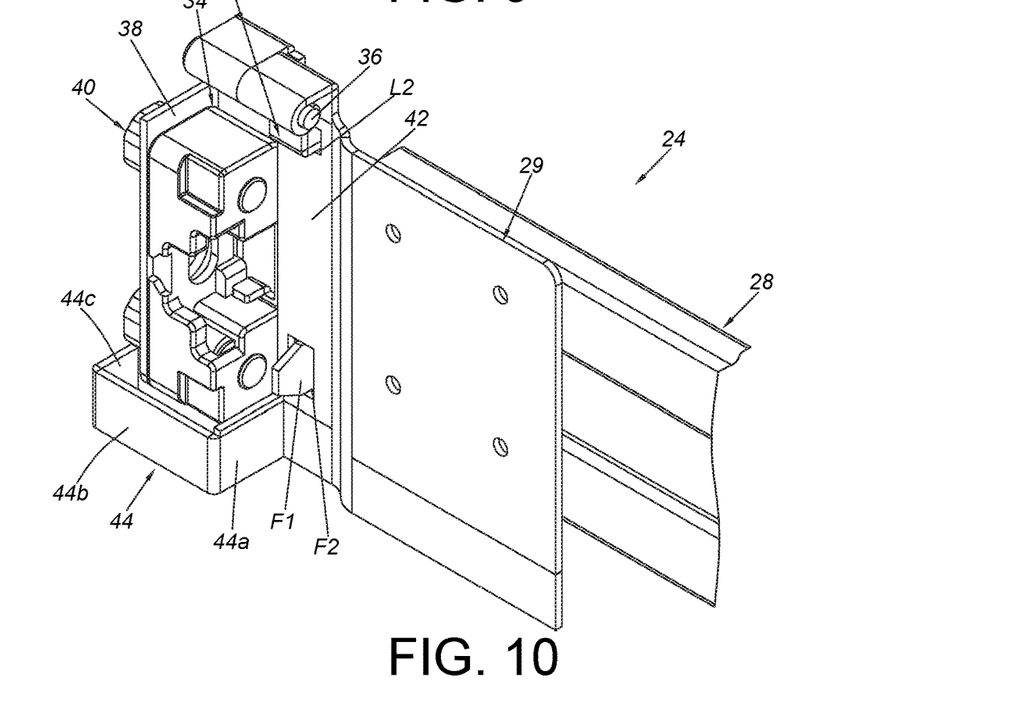
FIG. 10 is a diagram showing the first bracket mechanism being in the locking state according to an embodiment of the present invention.

As shown in FIG. 10, when the mounting device 34 and the connecting wall 29 are in the locking state, the at least one mounting member 40 is adjacent to the connection wall 29 to be closed relative to each other, and the first structure F1 and the second structure F2 are connected to each other in order to hold the mounting device 34 and the connecting wall 29 in the locking state.

Therefore, the slide rail assembly and the bracket mechanism thereof according to the embodiments of the present invention are characterized in that:

1. The mounting device 34 and the connecting wall 29 are movable relative to each other to be in a locking state or an unlocking state. When the mounting device 34 and the connecting wall 29 are in the unlocking state, the at least one mounting member 40 is away from the connecting wall 29 to be opened relative to each other; and when the mounting device 34 and the connecting wall 29 are in the locking state, the at least one mounting member 40 is adjacent to the connecting wall 29 to be closed relative to each other.

2. The pivot shaft 36 is arranged in the direction substantially identical to the longitudinal direction of the connecting wall 29 (or the longitudinal direction of the slide rail of the slide rail assembly 20), and the connecting wall 29 and the mounting device 34 are pivoted relative to each other through the pivot shaft 36.

3. The at least one mounting member 40 is arranged on the mounting device 34. Therefore, when the mounting device 34 and the connecting wall 29 are in the locking state and when the at least one mounting member 40 is mounted to the first post 46a in advance to work as a supporting point, the connecting wall 29 can be intuitively operated by the user to rotate relative to the mounting device 34 into the locking state, in order to mount the slide rail assembly 20 to the first post 46a. Thereafter, the user can mount the second bracket mechanism 26 to the second post 46b. Overall, the first bracket mechanism 24 has a specific configuration to allow the user to stand at the same position to easily mount the slide rail assembly 20 to the first post 46a and the second post 46b in order to complete a so-called one-man mounting and detaching operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket mechanism, comprising:
a connecting wall; and
a mounting device, wherein the mounting device and the connecting wall are movable relative to each other to be in one of a locking state and an unlocking state;
wherein the mounting device comprises at least one mounting member configured to be mounted to a post;
wherein when the mounting device and the connecting wall are in the locking state, the at least one mounting member is adjacent to the connecting wall to be closed relative to each other;
wherein when the mounting device and the connecting wall are in the unlocking state, the at least one mounting member is away from the connecting wall to be opened relative to each other;
wherein the connecting wall and the mounting device are pivoted relative to each other;
wherein the connecting wall has a longitudinal length, and the bracket mechanism further comprises a pivot shaft the pivot shaft is arranged in a direction substantially identical to a direction of the longitudinal length; the connecting wall and the mounting device are pivoted relative to each other through the pivot shaft.

2. The bracket mechanism of claim 1, wherein the mounting device further comprises an end wall, the at least one mounting member is arranged on the end wall, and the end wall is pivotally connected to the connecting wall through the pivot shaft.

3. The bracket mechanism of claim 2, wherein the mounting device further comprises an extension wall substantially perpendicularly connected to the end wall, and the extension wall and the connecting wall are respectively arranged with a first structure and a second structure associated to each other; wherein when the mounting device and the connecting wall are in the locking state, the first structure and the second structure are connected to each other; wherein when the mounting device and the connecting wall are in the unlocking state, the first structure and the second structure are not connected to each other.

4. The bracket mechanism of claim 1, wherein the connecting wall and/or the mounting device has a limiting feature; wherein when the mounting device and the connecting wall are in the unlocking state relative to each other, the mounting device and the connecting wall are held in the unlocking state through the limiting feature.

5. The bracket mechanism of claim 1, wherein the connecting wall is arranged with a fastening member; wherein when the mounting device and the connecting wall are in the locking state, the fastening member is adjacent to the at least one mounting member; wherein when the mounting device and the connecting wall are in the unlocking state, the fastening member is away from the at least one mounting member.

6. A bracket mechanism, comprising:
a connecting wall having a longitudinal length;
a mounting device comprising at least one mounting member; and
a pivot shaft arranged in a direction substantially identical to a direction of the longitudinal length;
wherein the connecting wall and the mounting device are pivoted relative to each other through the pivot shaft;
wherein the mounting device further comprises an end wall, the at least one mounting member is arranged on the end wall, and the end wall is pivotally connected to the connecting wall through the pivot shaft;
wherein the mounting device further comprises an extension wall substantially perpendicularly connected to the end wall, and the extension wall and the connecting wall are respectively arranged with a first structure and a second structure associated to each other; wherein when the mounting device and the connecting wall are rotated relative to each other to be closed, the first structure and the second structure are connected to each other; wherein when the mounting device and the connecting wall are rotated relative to each other to be opened, the first structure and the second structure are not connected to each other.

7. The bracket mechanism of claim 6, wherein the connecting wall is arranged on a slide rail.

8. The bracket mechanism of claim 6, wherein the connecting wall or the mounting device is arranged with a fastening member configured to mount the bracket mechanism to a target object.

9. A slide rail assembly, comprising:
a first rail;
a first bracket mechanism arranged adjacent to a first end part of the first rail; and
a second bracket mechanism arranged adjacent to a second end part of the first rail away from the first end part;
wherein the first bracket mechanism is longitudinally movable relative to the first rail through an extension rail;
wherein the first bracket mechanism comprises:
a connecting wall arranged on the extension rail; and
a mounting device, wherein the mounting device and the connecting wall are movable relative to each other to be in one of a locking state and an unlocking state;
wherein the connecting wall and the mounting device are pivoted relative to each other;
wherein the connecting wall has a longitudinal length, and the first bracket mechanism further comprises a pivot shaft the pivot shaft is arranged in a direction substantially identical to a direction of the longitudinal length; the connecting wall and the mounting device are pivoted relative to each other through the pivot shaft.

10. The slide rail assembly of claim 9, wherein the mounting device comprises an end wall and at least one mounting member arranged on the end wall, and the end wall is pivotally connected to the connecting wall through the pivot shaft.

11. The slide rail assembly of claim 10, wherein the mounting device further comprises an extension wall substantially perpendicularly connected to the end wall, and the extension wall and the connecting wall are respectively arranged with a first structure and a second structure associated to each other; wherein when the mounting device and the connecting wall are in the locking state, the first structure and the second structure are connected to each other; wherein when the mounting device and the connecting wall are in the unlocking state, the first structure and the second structure are not connected to each other.

12. The slide rail assembly of claim 9, wherein the connecting wall and/or the mounting device has a limiting feature; wherein when the mounting device and the connecting wall are in the unlocking state relative to each other, the mounting device and the connecting wall are held in the unlocking state through the limiting feature.

13. The slide rail assembly of claim 9, wherein the connecting wall or the mounting device is arranged with a fastening member; wherein when the mounting device and the connecting wall are in the locking state, the fastening member is adjacent to the other one of the connecting wall and the mounting device; wherein when the mounting device and the connecting wall are in the unlocking state, the fastening member is away from the other one of the connecting wall and the mounting device.

14. The slide rail assembly of claim 10, wherein the at least one mounting member of the first bracket mechanism is configured to mount the first rail to a first post, and the second bracket mechanism comprises at least one connecting member configured to mount the first rail to a second post; the slide rail assembly further comprises a second rail longitudinally movable relative to the first rail, and the second rail and the extension rail are respectively located at two sides of the first rail.

* * * * *